US 8,552,781 B2

(12) United States Patent
Mosalikanti et al.

(10) Patent No.: US 8,552,781 B2
(45) Date of Patent: Oct. 8, 2013

(54) DIGITAL QUADRATURE PHASE CORRECTION

(75) Inventors: Praveen Mosalikanti, Portland, OR (US); Nasser Kurd, Portland, OR (US)

(73) Assignee: Intel Corporation, Santa Clara, CA (US)

(*) Notice: Subject to any disclaimer, the term of this patent is extended or adjusted under 35 U.S.C. 154(b) by 387 days.

(21) Appl. No.: 12/640,763

(22) Filed: Dec. 17, 2009

(65) Prior Publication Data

US 2011/0148498 A1     Jun. 23, 2011

(51) Int. Cl.
*H03K 3/00* (2006.01)
*H03K 5/13* (2006.01)
*H03H 11/16* (2006.01)

(52) U.S. Cl.
USPC .................................. 327/243; 327/231

(58) Field of Classification Search
USPC .............. 327/231, 233–237, 243, 244, 28–38
See application file for complete search history.

(56) References Cited

U.S. PATENT DOCUMENTS

2009/0289672 A1* 11/2009 Hua et al. ............... 327/147
2010/0102868 A1* 4/2010 Kim et al. ............... 327/291

* cited by examiner

*Primary Examiner* — Lincoln Donovan
*Assistant Examiner* — Diana J Cheng
(74) *Attorney, Agent, or Firm* — Garrett IP, LLC

(57) ABSTRACT

Methods and systems to adjust a phase difference between signals, such as to perform quadrature phase correction. First and second signals are digitally compared, such as with exclusive OR circuitry, to provide a comparison signal having a duty cycle representative of a phase difference between the signals. A phase delay of one or both of the first and second signals is adjusted until the duty cycle of the comparison signal corresponds to a desired phase difference. In a clock and data recovery system, the signals may correspond to a zero degree phase of a first phase interpolator and a ninety degree phase of a second phase interpolator, and digital codes to the first and second phase interpolators may be adjusted to provide a fifty percent duty cycle in the comparison signal.

8 Claims, 4 Drawing Sheets

DIGITAL QUADRATURE PHASE CORRECTION

BACKGROUND

Phase separated signals are used in a variety of situations. Clock and data recovery (CDR) mechanisms, for example, utilize an edge clock and a data clock phase separated by 90°, and corresponding complements. The edge clocks may be used to take edge samples, and the data clocks may be used to take data samples. A CDR control loop may use the samples to adjust edges of the clock signals to align the edge clocks with data transitions so that the data clocks are nominally in the centers of the data eyes. Errors in the 90° phase separation between the edge clock and the data clock may result in reduced margin.

Conventional techniques to correct errors in 90° phase separation, referred to herein as quadrature phase correction, are based on assumptions that introduce errors or use relatively complex finite state machines and sensitive analog circuits, which may be inefficient in terms of area and power consumption, and which may be relatively difficult to debug.

BRIEF DESCRIPTION OF THE DRAWINGS/FIGURES

Figure 1:
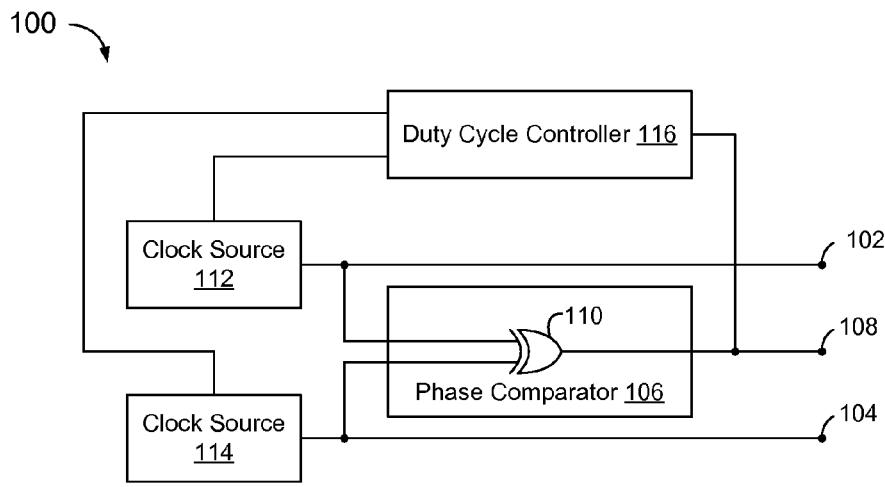
FIG. 1 is a block diagram of a phase adjustment system to generate a comparison signal having a duty cycle representative of a phase difference between first and second clock signals, and to adjust phases of the first and second clock signals in response to the duty cycle.

In the drawings, the leftmost digit(s) of a reference number identifies the drawing in which the reference number first appears.

DETAILED DESCRIPTION

Disclosed herein are methods and systems to adjust a phase difference between signals, such as to perform quadrature phase correction.

FIG. 1 is a block diagram of a phase adjustment system 100 to adjust a phase difference between two or more signals, illustrated here as clock signals 102 and 104.

Phase adjustment system 100 includes a phase comparator 106 to output a comparison signal 108 having a duty cycle representative of a phase difference between first and second clock signals 102 and 104. Phase comparator 106 may include an exclusive OR circuit 110.

Figure 2:
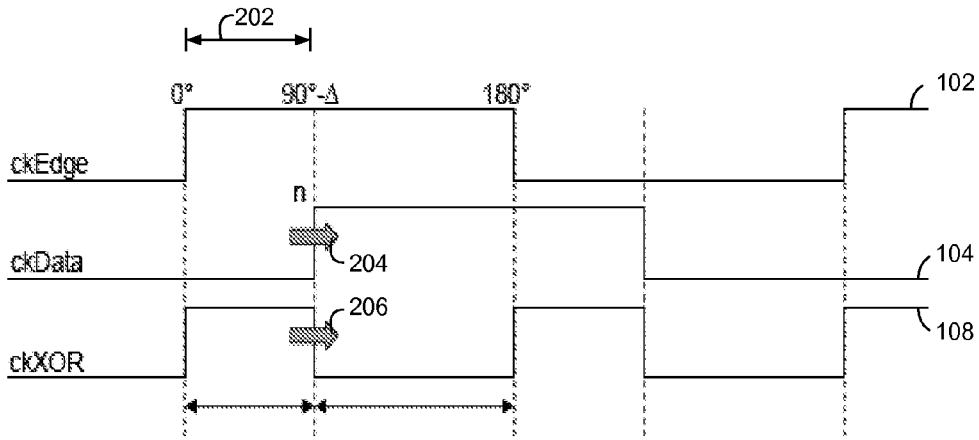
FIG. 2 is a graphic depiction of example clock signals and a corresponding comparison signal.
Figure 3:
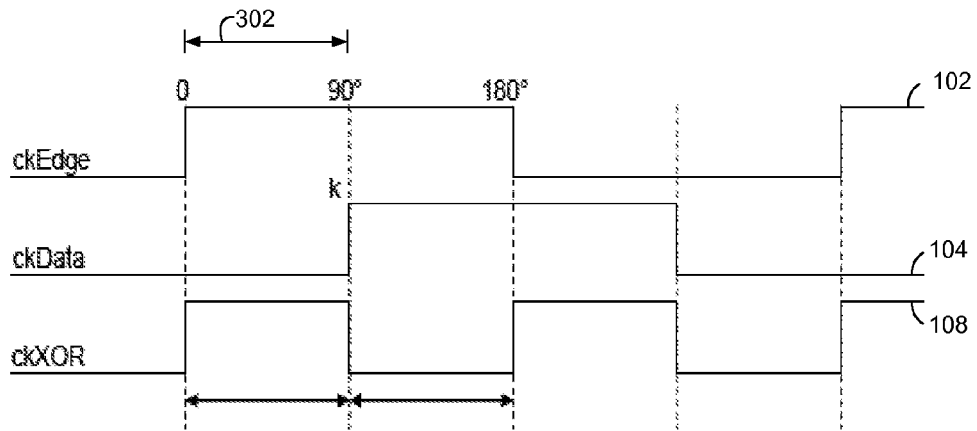
FIG. 3 is another graphic depiction of example clock signals and a corresponding comparison signal.

FIGS. 2 and 3 are graphic depictions of example clock signals 102 and 104, and corresponding comparison signals 108.

As depicted in FIGS. 2 and 3, comparison signal 108 is active when clock signal 102 or clock signal 104 is active, inactive when clock signals 102 and 104 are both active, and inactive when clock signals 102 and 104 are both inactive.

In the example of FIG. 2, a phase difference 202 between clock signals 102 and 104 is less than 90 degrees, and corresponding comparison signal 108 has a duty cycle of less than 50 percent.

In the example of FIG. 3, a phase difference 302 between clock signals 102 and 104 is substantially equal to 90 degrees, and corresponding comparison signal 108 has a duty cycle of approximately 50 percent.

Where the phase difference between clock signals 102 and 104 is substantially zero, comparison signal 108 has a duty cycle of approximately zero.

Where the phase difference between clock signals 102 and 104 is substantially equal to 180 degrees, comparison signal 108 has a duty cycle of approximately 100 percent.

In FIG. 1, phase adjustment system 100 further includes first and second phase controllable clock sources 112 and 114, and a duty cycle controller 116 to control one or both of clock sources 112 and 114 in response to the duty cycle of comparison signal 108.

Duty cycle controller 116 may be configured to control one or both of clock sources 112 and 114 until the duty cycle of comparison signal 108 is substantially equal to a desired value and/or within a threshold range.

For example, and without limitation, where clock signals 102 and 104 are to be 90 degrees out of phase with one another, and where clock signals 102 and 104 are initially as depicted in FIG. 2, duty cycle controller 116 may control clock source 112 to increase a phase delay of clock signal 102. This effectively increases phase delay 202 in a direction 204, and increases the duty cycle of comparison signal 108 as illustrated by an arrow 206. Duty cycle controller 116 may control clock source 112 until the duty cycle of comparison signal 108 is approximately 50 percent, as depicted in FIG. 3.

A 90 degree phase difference between clock signals 102 and 104 may be useful, for example, in a clock and data recovery (CDR) system, such as described below with respect to FIG. 4.

Figure 4:
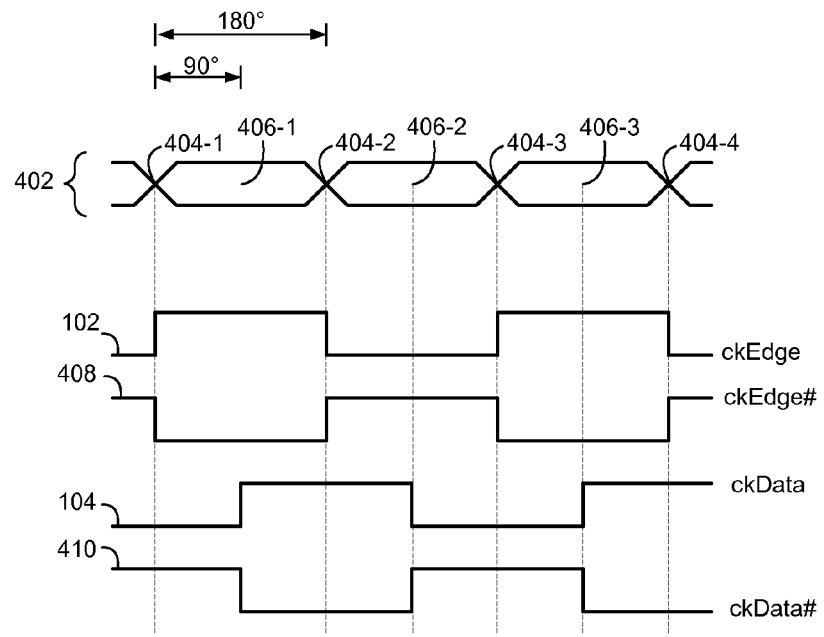
FIG. 4 is a graphic depiction of data, edge and data signals, and corresponding complementary signals.

FIG. 4 is a graphic depiction of data 402, having data transitions 404 and data eye centers 406 between data transitions 404. FIG. 4 also depicts example clock signals 102 and 104, and corresponding complementary signals 408 and 410. Clock signal 102 and its complement 408 may correspond to an edge clock signal, ckEdge, and its complement, ckEdge#, respectively. Clock signal 104 and its complement 410, may correspond to a data clock signal, ckData, and its complement, ckData#, respectively.

Data clocks 104 and 410 may be used to take data samples of data 402. Edge clocks 102 and 408 may be used to take edge samples of data 402.

A clock data recovery loop may use the edge samples to align edge clocks 102 and 408 with data transitions 404. When rising edges of edge clock signal 102 and its complement 408 are in alignment with corresponding data transitions 404, and when the phase difference between edge clock signal 102 and data clock signal 104 is approximately 90 degrees, rising edges of data clock signal 102 and its complement 410 are in alignment with data eye centers 406. Error in the 90° phase separation between edge clock signal 102 and data clock signal 104 may result in reduced sampling margins.

In FIG. 1, clock sources 112 and 114 may include phase interpolators to generate and adjust clocks 102, 104, 408, and 410, such as described below with respect to FIG. 6.

Duty cycle controller 116 may be configured to control clock source 112 to increase a phase delay of clock signal 102 when the duty cycle of comparison signal 108 is less than 50 percent, such as depicted in FIG. 2, and to decrease the phase delay of clock signal 102 when the duty cycle of comparison signal 108 is greater than 50 percent.

Duty cycle controller 116 may be configured to iteratively adjust phase delay applied to one or both of clock signals 102 and 104 until a desired duty cycle is obtained in comparison signal 108.

Duty cycle controller 116 may be configured to adjust a phase delay by relatively large increments when the duty cycle of comparison signal 108 differs relatively significantly from a desired duty cycle, and to adjust the phase delay by relatively small increments as the duty cycle of comparison signal 108 approaches the desired duty cycle.

Duty cycle controller 116 may be configured to adjust duty cycles of clock signals 102 and 104, such as described below with respect to FIG. 5.

Figure 5:
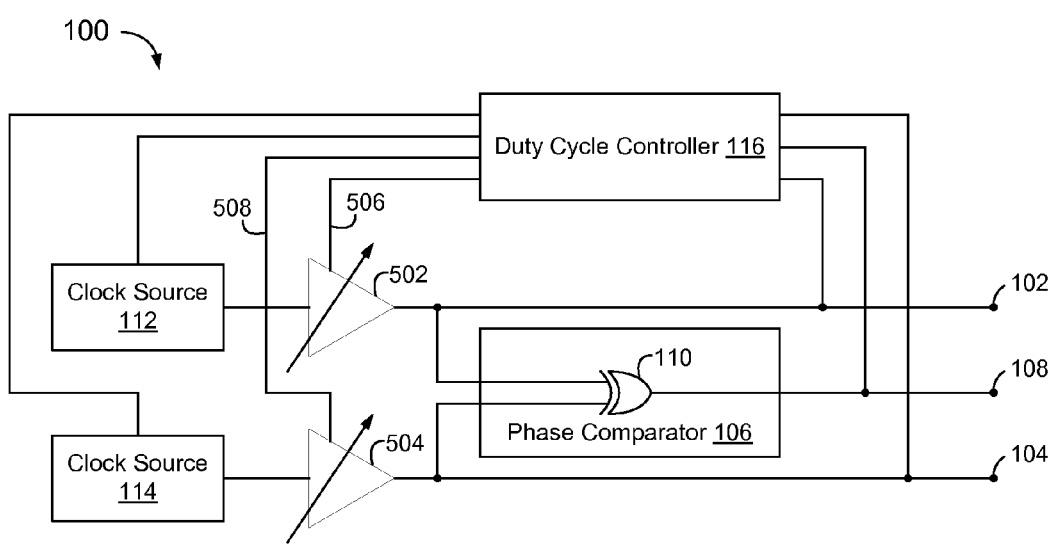
FIG. 5 is a block diagram of the phase adjustment system of FIG. 1, further including first and second duty cycle controllable buffers to adjust duty cycles of the first and second clock signals.

FIG. 5 is a block diagram of system 100, further including first and second duty cycle controllable buffers 502 and 504 to adjust duty cycles of first and second clock signals 102 and 104, respectively.

Duty cycle controllable buffers 502 and 504 may each include circuitry to control rising and/or falling edges of corresponding clock signals 102 and 104, and thus corresponding pulse-widths, based on digital codes from duty cycle controller 116.

Duty cycle controller 116 may include a finite state machine configured to examine duty cycles of clock signals 102 and 104, determine corresponding duty cycle errors, and control corresponding buffers 502 and 504 to increase and/or decrease pulse widths of corresponding clock signals 102 and 104 until the duty cycles are substantially equal to a desired value and/or within a desired range.

Duty cycle controller 116 may be configured to adjust and/or maintain duty cycles of clock signals 102 and 104 at, for example, approximately 50 percent, such as depicted in FIGS. 2 and 3.

Figure 6:
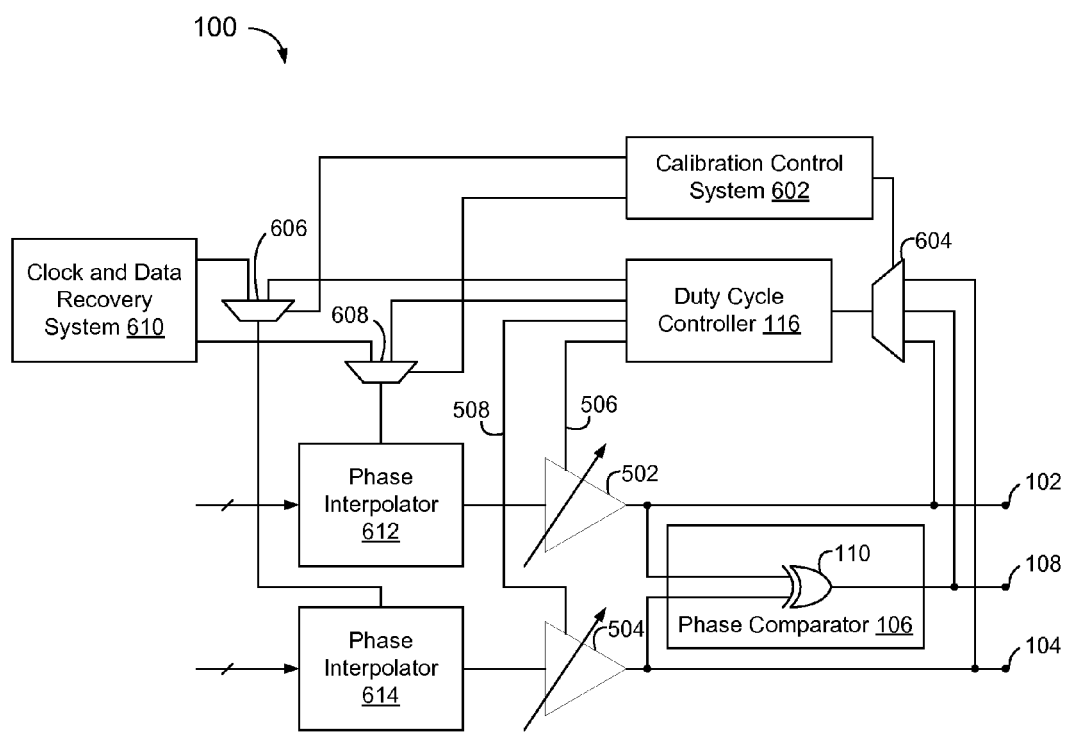
FIG. 6 is a block diagram of the phase adjustment system of FIG. 5, further including phase interpolators to interpolate amongst a plurality of input signals to generate the first and second clock signals.

FIG. 6 is a block diagram of system 100, wherein first and second clock sources 112 and 114 of FIG. 1 include first and second phase interpolators 612 and 614 to interpolate amongst a plurality of input clock signals to generate corresponding clock signals 102 and 104.

In FIG. 6, system 100 includes a clock and data recovery (CDR) system 610. Clock signals 102 and 104, and corresponding complementary clock signals, may correspond to edge and data clocks as described above with respect to FIG. 4.

In FIG. 6, system 100 further includes a calibration system 602 and multiplexers 604, 606, and 608. During a calibration mode, calibration system 602 may control multiplexer 604 to provide first and second clock signals 102 and 104, and comparison signal 102, to duty cycle controller 116, and may control multiplexers 606 and 608 to provide outputs of duty cycle controller 116 to corresponding phase interpolators 112 and 114. During a normal operation mode, calibration system 602 may control multiplexers 606 and 608 to provide control signals from clock data recovery system 610 to phase interpolators 112 and 114.

Phase interpolator code values determined for phase interpolators 612 and 614 during calibration may retained within the phase interpolators 612 and 614 and/or provided to CDR system 610 to be used as offset values during normal operation.

Phase offset code values determined for buffers 502 and 504 during calibration may be applied to buffers 502 and 504 during normal operation.

Figure 7:
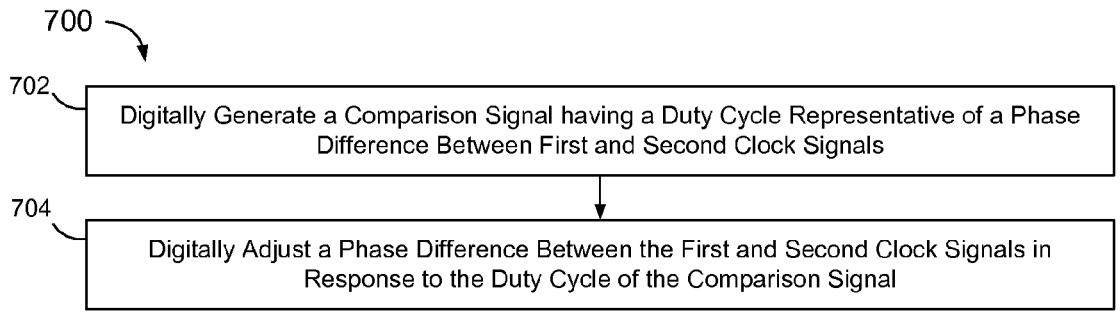
FIG. 7 is a process flowchart of a method of adjusting a phase difference between a plurality of clock signals.

FIG. 7 is a process flowchart of a method 700 of adjusting a phase difference between a plurality of clock signals. Method 700 may be implemented such as described in one or more examples above with respect to system 100. Method 700 is not, however, limited to the examples of system 100.

At 702, a comparison signal is digitally generated, having a duty cycle representative of a phase difference between first and second clock signals. The digitally generating of the comparison signal may include exclusively OR'ing the first and second clock signals to generate the comparison signal.

At 704, a phase difference between the first and second clock signals is digitally adjusted in response to the duty cycle of the comparison signal.

The adjusting may include adjusting a phase delay of one or both of the first and second clock signals.

The adjusting may include setting an initial phase delay of one or both of the first and second clock signals to provide an initial phase difference between the first and second clock signals, and adjusting the phase delay of one or both of the first and second clock signals in response to the duty cycle, so as to adjust the initial phase difference.

The adjusting may include providing control settings to a phase interpolator configured to control the phase of one or both of the first and second clock signals.

The adjusting may include adjusting the phase difference to provide an approximately 50 percent duty cycle in the comparison signal.

Figure 8:
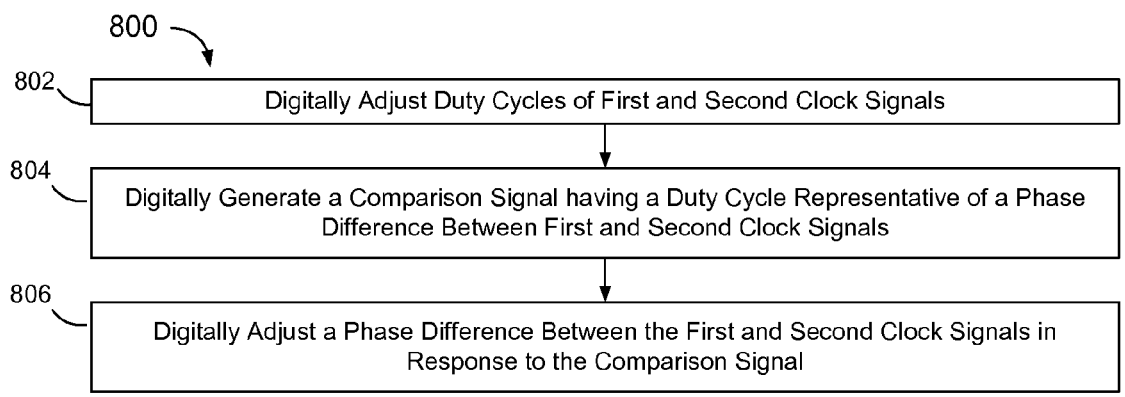
FIG. 8 is a process flowchart of another method of adjusting a phase difference between a plurality of clock signals.

FIG. 8 is a process flowchart of another method 800 of adjusting a phase difference between a plurality of clock signals. Method 800 may be implemented such as described in one or more examples above with respect to system 100. Method 800 is not, however, limited to the examples of system 100.

At 802, duty cycles of first and second clock signals are digitally adjusted. The duty cycles may be adjusted to, for example, 50 percent.

The digitally adjusting of the duty cycles at 802 may include adjusting rising and/or falling edges of the clock signals to adjust corresponding pulse-widths.

At 804, a comparison signal is digitally generated, having a duty cycle representative of a phase difference between first and second clock signals, such as described above with respect to 702 in FIG. 7.

At 806, a phase difference between the first and second clock signals is digitally adjusted in response to the duty cycle of the comparison signal, such as described above with respect to 704 in FIG. 7.

Figure 9:
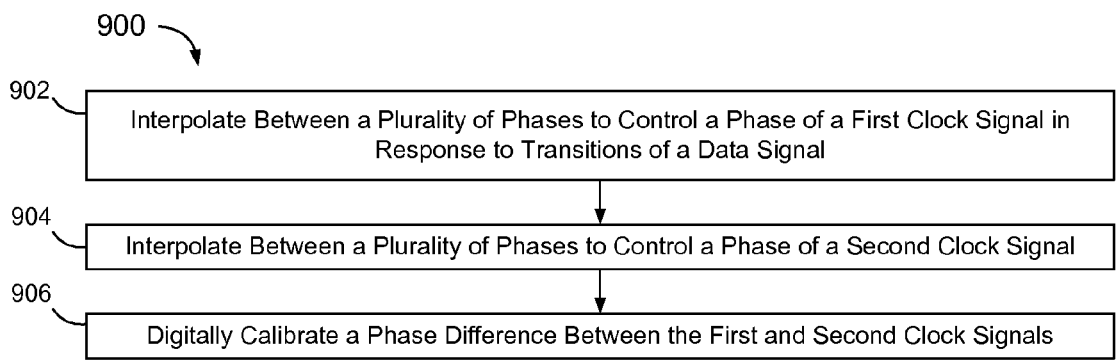
FIG. 9 is a process flowchart of a method 900 of digitally calibrating a phase difference between clock signals generated by phase interpolation.

FIG. 9 is a process flowchart of a method 900 of digitally calibrating a phase difference between clock signals generated by phase interpolation. Method 900 may be implemented such as described in one or more examples above with respect to system 100. Method 900 is not, however, limited to the examples of system 100.

At 902, a first interpolation is performed between a plurality of phases to control a phase of a first clock signal in response to transitions of a data signal.

At 904, a second interpolation is performed between a plurality of phases to control a phase of a second clock signal.

At 906, a phase difference between the first and second clock signals is digitally calibrated.

The digitally calibrating at 906 may include digitally generating a comparison signal having a duty cycle representative of a phase difference between the first and second clock signals, such as described above with respect to 702 in FIG. 7. The digitally calibrating at 906 may further include digitally adjusting the phase difference between the first and second clock signals in response to the duty cycle of the comparison signal, such as described above with respect to 704 in FIG. 7.

The digitally calibrating at 906 may include digitally adjusting duty cycles of the first and second clock signals, such as described above with respect to 802 in FIG. 8.

Methods and systems are disclosed herein to calibrate phase differences between clock signals based on comparisons of the actual phases of the clock signals. Comparison of the actual phase difference or true separation of the clock signals may permit calibration of the phase difference independent of non-linearities of the clock sources and independent of process variations between the clock sources. Where the corresponding clock sources are phase interpolators, a comparison may include comparing a zero degree of a first phase interpolator with a ninety degree phase of a second phase interpolator.

Methods and systems disclosed herein may be implemented with relatively non-complex algorithms and with digital circuits rather than sensitive analog circuits having relatively narrow operating windows.

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. A system, comprising:
    first and second phase controllable clock sources to produce respective first and second clock signals;
    a digital comparator to generate a comparison signal having a duty cycle representative of a phase difference between the first and second clock signals;
    a digital controller to adjust a duty cycle of each of the first and second clock signals, and the phase difference between the first and second clock signals, based on the comparison signal;
    a first multiplexer (MUX) to selectively provide the first and second clock signals, and the comparison signal, to the digital controller; and
    a calibration system configured to control the first MUX.

2. The system of claim 1, further comprising:
    a clock and data recovery (CDR) system to produce first and second CDR control signals;
    a second MUX to provide a selected one of the first CDR control signal and a first output of the duty cycle controller to the first clock source; and
    a third MUX to provide a selected one of the second CDR control signal and a second output of the duty cycle controller to the second clock source,
    wherein the calibration system is configured to control the first, second, and third MUXs.

3. The system of claim 2, wherein the calibration system is configured to control the first, second, and third MUXs in a calibration mode, to calibrate one of the phase difference and the duty cycles, so as to cause
    the first MUX to provide the first and second clock signals, and the comparison signal, to the duty cycle controller, and
    the second and third MUXs to provide the first and second outputs of the duty cycle controller to the first and second clock sources, respectively.

4. The system of claim 3, wherein the calibration system is further configured, in a normal mode, to cause the second and third MUXs to provide the first and second CDR control signals, respectively, to corresponding ones of the first and second clock sources.

5. The system of claim 1, wherein each of the first and second phase controllable clock source includes:
    a respective phase interpolator; and
    a respective duty cycle controllable buffer, following the respective phase interpolator, to adjust the respective duty cycle responsive to a respective duty cycle control signal from the duty cycle controller.

6. The system of claim 1, wherein the digital controller is configured to adjust the phase difference between the first and second clock signals subsequent to adjustment of the duty cycles of the first and second clock signals.

7. The system of claim 6, wherein the digital controller is further configured to:
    set an initial phase delay of at least one of the first and second clock signals to provide an initial phase difference between the first and second clock signals, subsequent to adjustments of the duty cycles of the first and second clock signals; and
    adjust the phase delay of the at least one of the first and second clock signals in response to the duty cycle of the comparison signal to adjust the initial phase difference.

8. The system of claim 7, wherein the digital controller is further configured to:
    adjust the duty cycles of the first and second clock signals to provide a duty cycle of approximately fifty percent in each of the first and second clock signals;
    set a phase delay of the at least one of the first and second clock signals to provide an approximately ninety degree initial phase difference between the first and second clock signals; and
    adjust the phase delay of the at least one of the first and second clock signals in response to the duty cycle of the comparison signal to provide a duty cycle of approximately fifty percent in the comparison signal.

* * * * *